United States Patent [19]

Bright et al.

[11] Patent Number: 4,644,095
[45] Date of Patent: Feb. 17, 1987

[54] ENCLOSURE FOR OUTDOOR, GROUND LEVEL MOUNTED COMMUNICATION EQUIPMENT

[75] Inventors: William L. Bright; Michael L. Cheatham, both of Hood River, Oreg.

[73] Assignee: Western Power Products, Inc., Hood River, Oreg.

[21] Appl. No.: 701,752

[22] Filed: Feb. 14, 1985

[51] Int. Cl.$^4$ ............................................. H05K 5/04
[52] U.S. Cl. ................................. 174/50; 174/16 R; 174/38
[58] Field of Search .................... 174/50, 37, 38, 59, 174/60, 67, 16 R; 312/100; 52/27; 220/18; 292/263

[56] References Cited

U.S. PATENT DOCUMENTS

| | | | |
|---|---|---|---|
| 2,538,930 | 1/1951 | Zummach | 292/263 |
| 3,751,575 | 8/1973 | Barb | 174/38 X |
| 3,784,727 | 1/1974 | Haubein | 174/50 X |
| 3,841,032 | 10/1974 | Grannis | 52/27 |
| 4,083,618 | 4/1978 | Busch | 174/67 X |
| 4,246,436 | 1/1981 | Hoffman et al. | 174/50 X |

OTHER PUBLICATIONS

3M Brochure, 4200 Terminating Systems, 4/81.

Primary Examiner—A. T. Grimley
Assistant Examiner—D. A. Tone
Attorney, Agent, or Firm—Eugene M. Eckelman

[57] ABSTRACT

A base member of an enclosure supports an upright frame having a box-like door hinged at its upper portion to the frame. The door when swung outwardly to an open position provides access to the interior of the enclosure and also provides a cover for equipment in the enclosure from weather elements. The upright frame may support double doors for providing an enclosure for different portions of communications equipment, the double doors also providing selected locked access to authorized personnel. The base member is constructed of two separable parts in an arrangement such that these parts can be replaced by larger parts when the capacity of the communications equipment is to be expanded. The enclosure is preferably constructed of a rust and corrosion proof plastic material and one that requires little or no maintenance.

14 Claims, 10 Drawing Figures

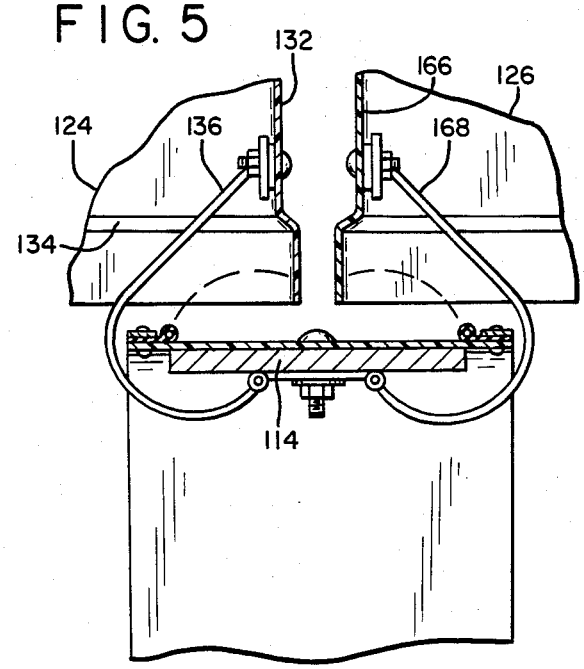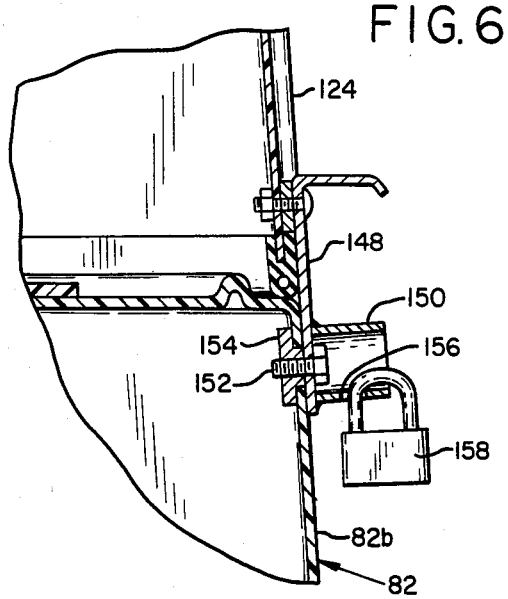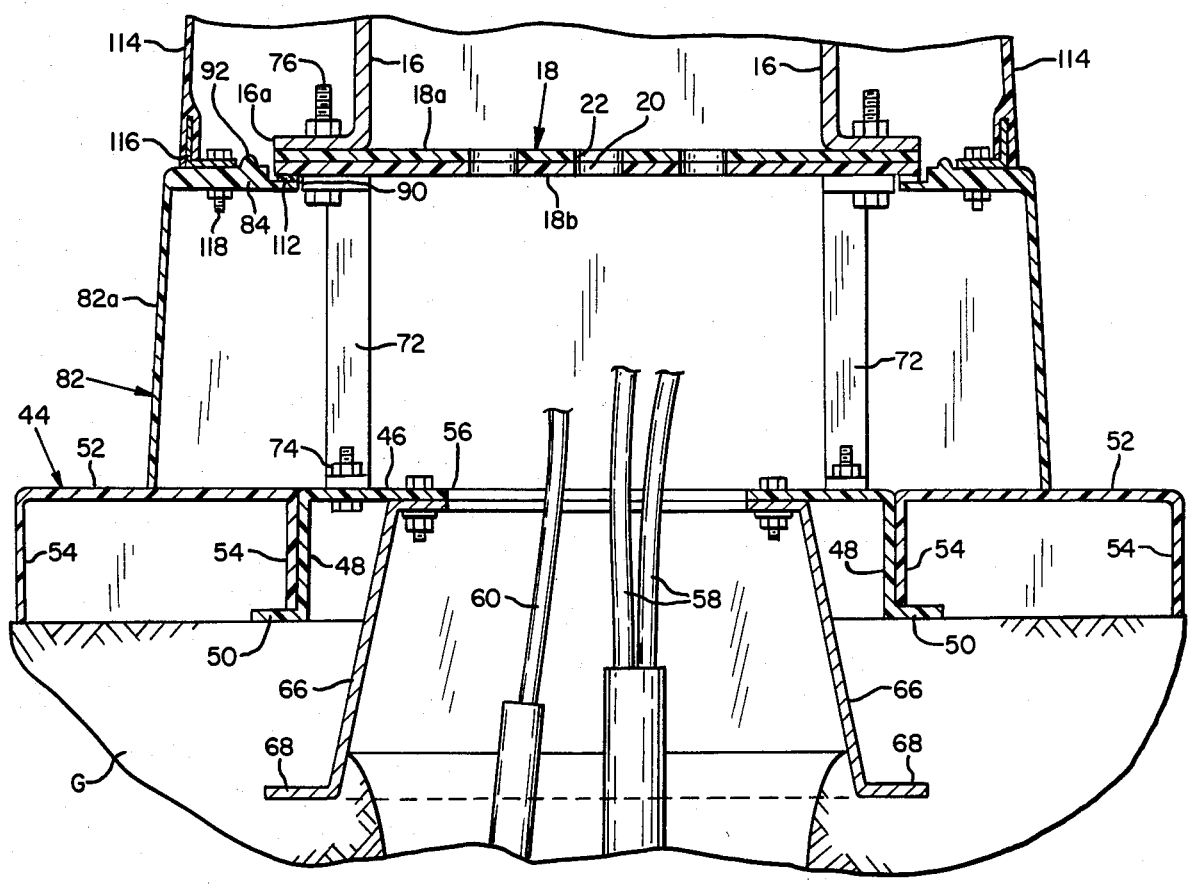

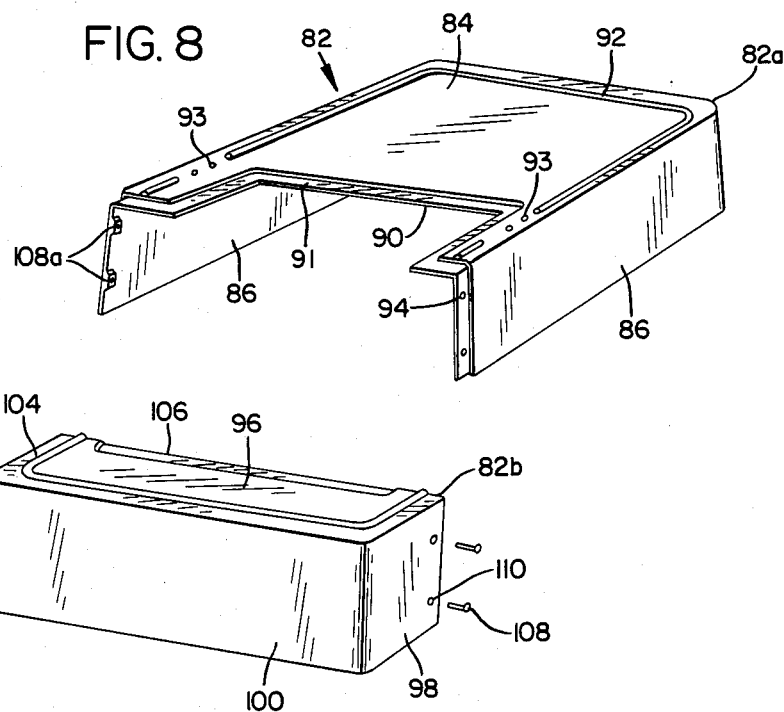
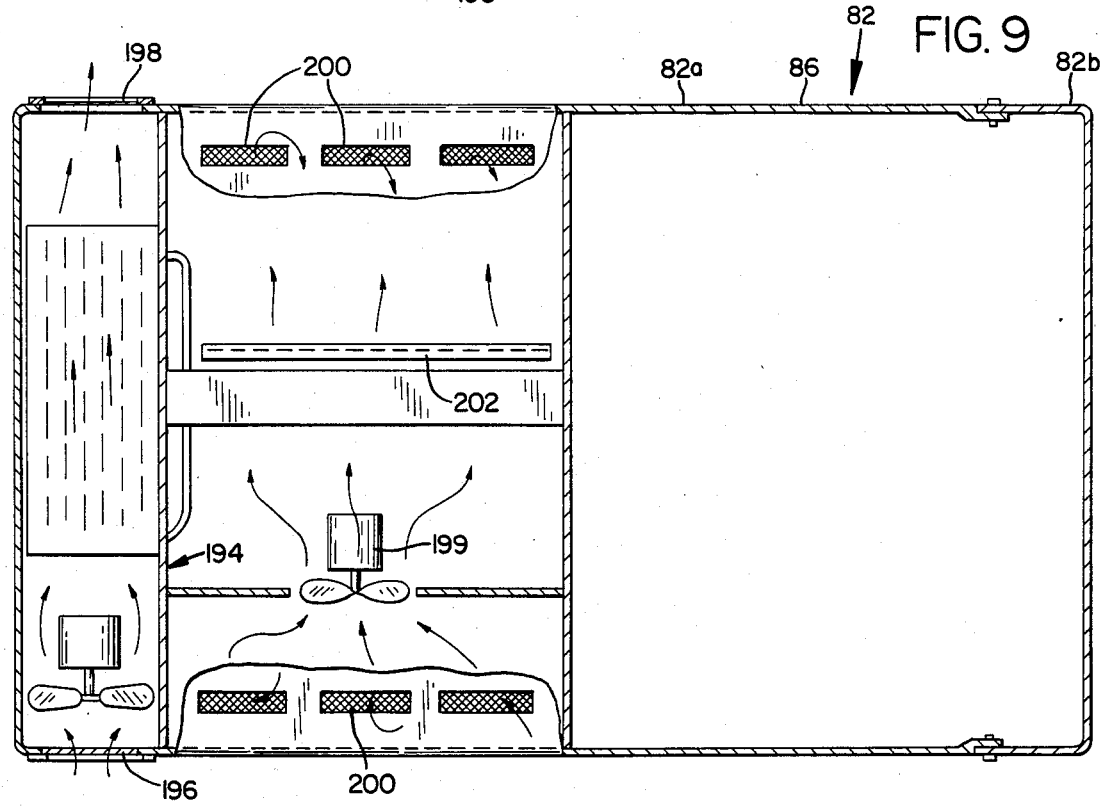

1

ENCLOSURE FOR OUTDOOR, GROUND LEVEL MOUNTED COMMUNICATION EQUIPMENT

BACKGROUND OF THE INVENTION

This invention relates to a new and useful enclosure for outdoor, ground level mounted communication equipment.

Enclosure structure is presently employed in outdoor locations for providing connection between incoming cables and cross connect and/or carrier mechanisms leading to customer service. Such enclosure structures have been found to possess disadvantages which result in costly maintenance, failure, and interruption of service when it is desired to increase the capacity of the system. For example, present enclosure structures have little or no means for increasing the capacity of the equipment without replacing the equipment and utilizing a larger cabinet, thus usually requiring that the telephone service to the users be interrupted and also requiring additional cable splicing and of course additional labor. Such enclosures also expose more equipment to operator access and weather than is necessary, it being a desirable feature that some of the equipment be accessible only to designated personnel.

SUMMARY OF THE INVENTION

An object of the invention is to provide an enclosure having a base member which supports door means in an arrangement such that the base member and door means are readily separated from the equipment which they enclose whereby when it is necessary to increase the capacity of communications equipment, one enclosure can be substituted for the other without interrupting the service to the customer.

Another object of the invention is to provide a novel enclosure of the type described utilizing a base member and an upright frame seated thereon which supports door means hinged at an upper end portion whereby when swung outwardly to an open position access is provided to the interior of the enclosure and also protection is provided against weather elements for equipment in the enclosure while the door means is open.

Still another object is to provide an enclosure with double door means in an arrangement such that two portions of the enclosed equipment can be made available to different designated personnel.

Yet another object is to provide air conditioning means in the base member as well as full temperature and moisture control means.

In carrying out these objectives, the present enclosure has a hollow base member and an integral upright frame that hingedly supports box-like door means which when open allow personnel to have access to the equipment and at the same time provide protection for the equipment against weather elements. The base member is formed of two parts in a novel arrangement which allows separation of the base member from the communications equipment such that if it is necessary to expand the capacity of the equipment, it is merely necessary to substitute a larger enclosure for the existing one. The upright frame supports one or two of the door means depending upon the requirement of the equipment to be enclosed, the two-door structure allowing a locking arrangement to be used which permits access to different portions of the equipment to different personnel if desired. The hollow structure of the base member allows air conditioning, temperature sensing and humidifying means to be enclosed therein.

BRIEF DESCRIPTION OF THE DRAWINGS

FIG. 5 is an enlarged fragmentary sectional view taken on the line 5—5 of FIG. 3;

FIGS. 6 and 7 are enlarged fragmentary sectional views taken on the lines 6—6 and 7—7 of FIG. 1, respectively;

FIG. 8 is an exploded perspective view of a base member of the invention;

FIG. 9 is an enlarged plan view of a base portion of the enclosure, a substantial portion of this view being broken away to show internal structure.

DETAILED DESCRIPTION OF PREFERRED EMBODIMENTS

Figure 2:
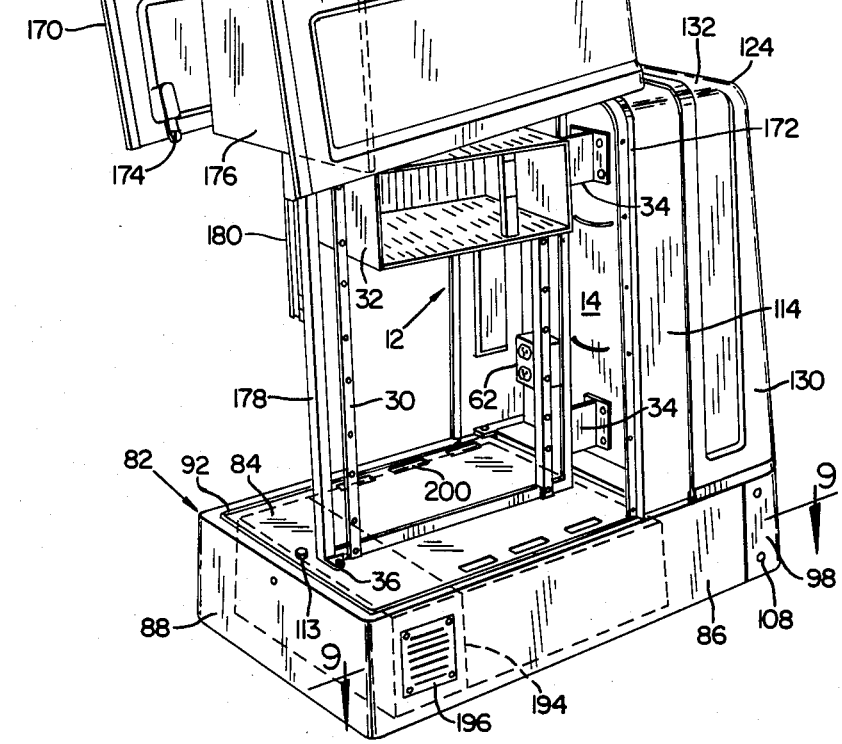
FIG. 2 is a perspective view of the enclosure taken from a carrier-enclosing end thereof, the end door for this carrier end being shown in open position.
Figure 3:
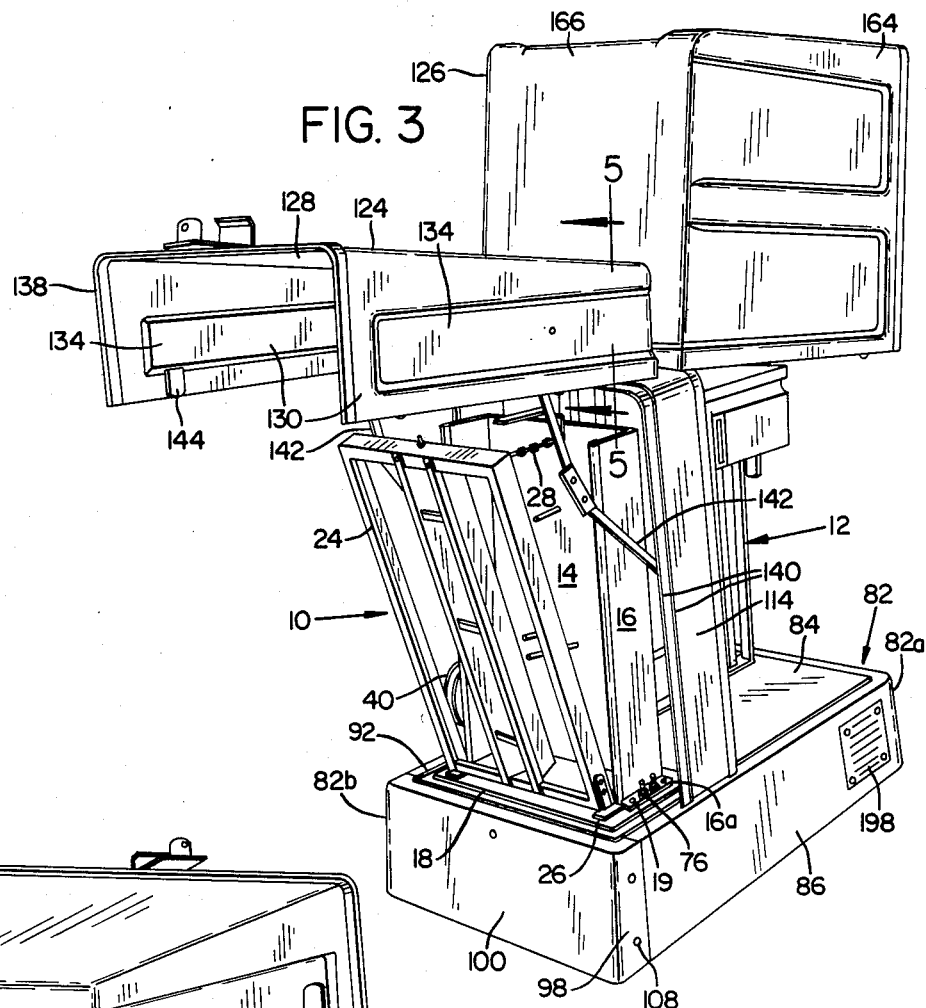
FIG. 3 is a perspective view of the enclosure with both end doors in open position.
Figure 4:
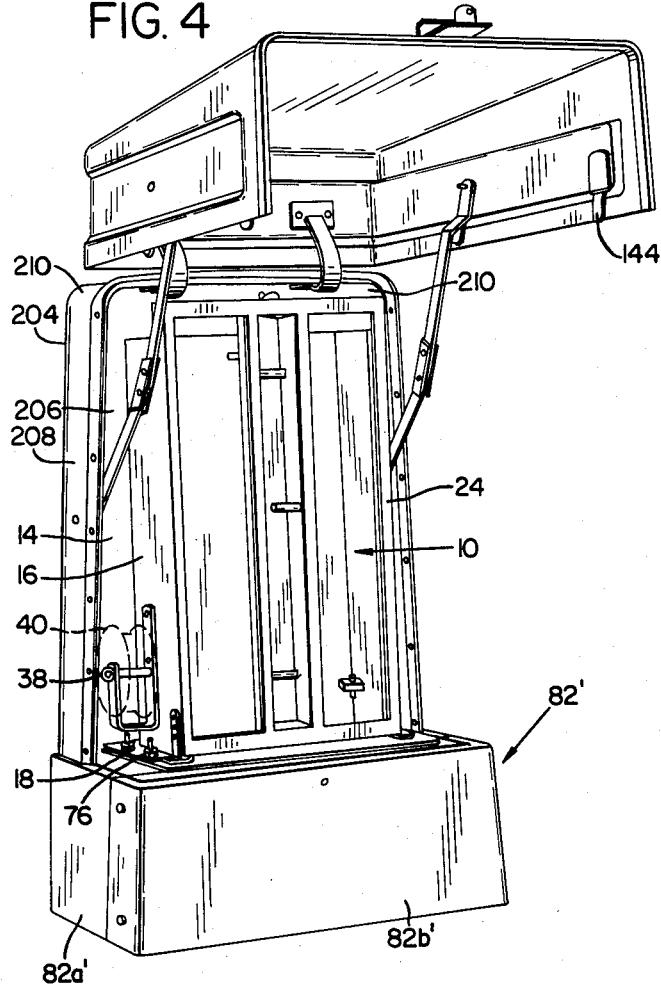
FIG. 4 is a perspective view of a modified form of the enclosure, this view being taken from a cross connect enclosing end thereof and showing an end door for this end in open position.
Figure 10:
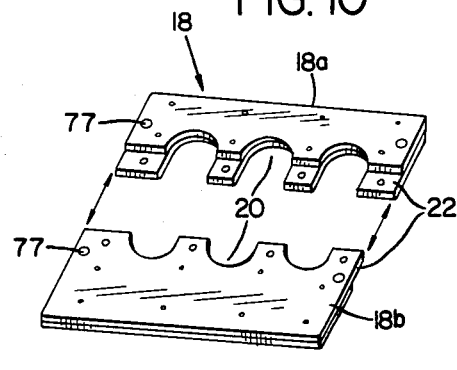
FIG. 10 is an exploded detail view of a floor plate of cross connect equipment.

With particular reference to the drawings and first to FIGS. 2-4 the present enclosure or cabinet is intended for association with conventional communication equipment comprising cross connect equipment 10, FIGS. 3 and 4, and if necessary a combination of the cross connect and carrier equipment 12, FIGS. 2 and 3. The cross connect equipment includes a vertical transverse wall 14 having side flanges 16 extending at right angles thereto and also having bottom outwardly angled portions 16a providing securement to a floor plate 18 by fasteners 19. Angled portions 16a also are arranged to provide releasable securement to a pad structure, to be described. Floor plate 18 has suitable opening means 20, FIG. 7, for cable means, to be described. This plate is constructed of two pieces 18a and 18b, best seen in FIG. 10, having a lap joint 22 longitudinally along its center with matching portions of the openings provided in each piece. Such construction allows the floor plate to be mounted around existing circuitry. These pieces are suitably secured together in their assembled position. The cross connect equipment includes an upstanding support frame 24 for securement of cross connect circuitry thereto. This frame has hinged support 26 at the bottom to floor plate 18 and such hinged arrangement allows the frame to swing out for access, as shown in FIG. 3, a limit chain 28 being connected at the top between such frame and the wall 12. Suitable latch means, not shown, are provided to hold the frame 21 in a vertical but releasable position.

Conventional carrier equipment 12 comprises an upstanding frame 30 with support means 32 for carrier circuitry. Frame 30 is arranged to be secured to the wall 14 by brackets 34 and to a base member, to be described, by one or more screws 36 at the outer end of such frame. Side flanges 16 of the wall 14 may include support means 38, FIG. 4, for supporting wire reels 40 or other supplies.

Figure 1:
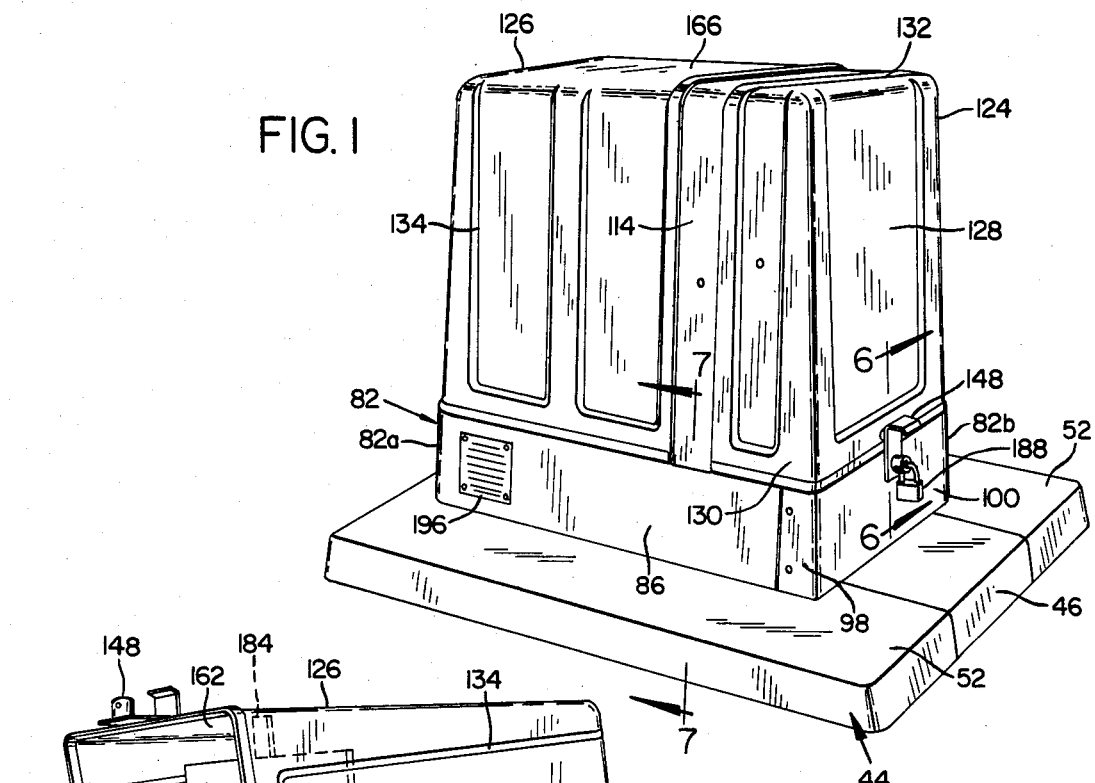
FIG. 1 is a perspective view of an enclosure embodying features of the invention, the end doors of this housing being shown in closed and locked position.

A first embodiment of the invention comprises a double opening enclosure, FIGS. 1-3, and a second embodiment comprises a single opening enclosure, FIG. 4. Each of these embodiments will be associated with a ground support pad 44 detailed in its structure in FIGS. 1 and 7. Such pad comprises a stationary portion 46 having a depending peripheral flange 48 with an outturned foot 50 arranged to seat on a supporting surface G such as the ground. Pad 44 also has an outer or auxiliary removable pad portion 52 extending around the two sides and one end and flush with the pad portion 46 at the other end. Pad portion 52 has inner and outer depending walls 54 the inner one of which seats freely on the foot 50.

An inner area of the pad portion 46 beneath the cross connect equipment 10 is provided with one or more openings 56 through which cable 58 enters from an underground location, such cable having access to the cross connect through the openings 20 in the floor plate 18. Openings 20 are closed when in use by a suitable filler material. Underground electrical cable 60 can also enter through openings 56 for supplying an electrical plug-in receptacle 62, FIG. 2, and other equipment as will be described hereinafter. The pad portion 46 has a depending flange extension 66 with outturned bottom ends 68 which anchor the pad in the ground by earth fill.

An upstanding bracket 72, FIG. 7, is secured to the pad portion 46 adjacent each side of the latter by bolts 74. These brackets are located vertically under the side flange 16 and are arranged to be bolted to the angled ends 16a of such flanges by bolts 76 extending through the upstanding bracket 72, through holes 77, FIG. 10, in the floor plate 18, and through the angled ends 16a. As apparent, an integrated unit exists which consists of the pad portion 46, its upstanding brackets 72, the cross connect portion 10 including the wall 14 and floor plate 18, and the carrier portion 12, and such unit will stand on the base by its own support.

With reference to the first embodiment of FIGS. 1-3, and also FIGS. 7-9, a base member 82 seats on the pad 44 and comprises two parts 82a and 82b. Part 82a includes a top wall 84, side walls 86, and one end wall 88, FIG. 2, the bottom and one end of this member being open. The top wall 84 has a cutout portion 90 at the open end and a defining recess 91 around this cutout portion. This recess also extends down the sides at the open end. The top wall has rib portions 92 adjacent the sides and at the closed end. Apertures 93 are provided in this top wall at each side of the cut-out portion 90, the rib 92 being interrupted at the apertures. Apertures 94 are provided in the side walls 86 adjacent the front and in front of the ribs 92 which extend down the sides.

Part 82b of the base member comprises a closure or cap for the open end of part 82a and has a top wall 96, side walls 98 and an end wall 100, the one end facing the open end of part 82a being open and the bottom also being open. Top wall 96 has a recess 106 at its open end of the same width dimension as cutout portion 90 and such top wall also is provided with a raised rib 104 at the sides and closed end. Base member part 82b fits on the part 82a with the side walls 98 partially overlapping side walls 86, the cutout portion 90 forming an opening which is closed by floor plate 18 seated around its edge in recesses 91 and 106. The two base parts are arranged to be secured together by bolts 108 extending through apertures 110 in the side walls 98 and through the apertures 94 in side walls 86, the nuts 108a for those bolts being integrated with the part 82a on the inside surface. The two parts 82a and 82b when connected form an inverted hollow housing. The floor plate 18 is arranged to be clamped down in partial overlapping engagement with the walls 84 and 96 over the cutout portion 90 FIG. 7, the brackets 72 being of a selected length such that when bolts 76 are tightened, a tight clamp-down engagement is accomplished. A seal 112 is provided between the floor plate 18 and the base member parts. A removable anchor bolt 113, FIG. 2, passes through a suitable hole in the top wall 84 of base part 82a adjacent the front and has suitable threaded connection at its lower end, not shown, with the pad portion 46 for securely anchoring the housing member in place. By loosening bolts 76 and removing screws 36 and 108, and also removing anchor screw 113, base member parts 82a and 82b can be detached from each other and slid endwise in opposite directions for removal from the cross-connect carrier mechanism. It is also apparent that pad portion 52 can be slid out the one end, namely, to the left in FIG. 1, for replacing it with a different size pad if desired.

Base member part 82a supports an inverted U-shaped pedestal or frame 114 which as seen in FIG. 7 has bottom integral brackets 116 by means of which this frame is securely attached to the top wall 84 of base member part 82a, as by bolts 118. Frame 114 is of sturdy structure and supports a pair of opposite opening doors or closures 124 and 126. Door 124 has a front end wall 128, side walls 130, and a top wall 132, the rear and bottom being open. The surfaces of this door have grooves 134 molded therein for rigidity. Such door has a hinged connection to the frame 114 by bow hinges 136, best seen in FIG. 5, and is configured when closed to enclose the cross connect equipment, a rear portion of the side walls 130 overlapping a portion of the frame 114 and the bottom edge abutting against the top walls 84 and 96 of the assembled base member parts 82a and 82b respectively.

The bottom edge of door 124 has a seal 138 thereon having sealing engagement with the base member when closed, and the frame 114 has seals 140 therearound engageable by the overlapping portions of the side walls 134 of the door. Releasable linkages 142 of conventional structure are connected between the door 124 and the frame 114 for holding it releasably in its open position FIG. 3. Horizontal tabs 144 on the inner surfaces of the walls 130 adjacent the bottom project beyond the side walls and fit on the inside of frame 114 for lateral stability of this door when closed.

Lock mechanism is provided between the bottom of door 124 and the base member and comprises a hasp 148, FIGS. 1 and 6, riveted to the door 124. A portion of this hasp overlaps the end wall 100 of the base member part 82b and has an integral tubular projection 150 arranged to receive a bolt 152 passing through the hasp and having threaded engagement with a nut 154 on the inner side of the base member 82b. Tubular projection 150 has an aperture 156 arranged to receive a padlock 158. The lock parts are dimensioned and arranged to prevent access by unauthorized personnel to the bolt head by a removing tool. Also, the bolt head may be of odd shape as a further safety feature of unauthorized removal.

Door 126 has a front end wall 162, side walls 164, and a top wall 166, the rear and bottom being open. The surfaces of this door have reinforcing grooves 134 similar to door 124, and the door has a bow hinge connection 168 to frame 114 also similar to door 124. This door is configured to enclose the carrier portion when closed, the bottom edge thereof having a seal 170 for engagement with the base member and also having engagement at the sides with seals 172 on the frame 114. It has horizontal tabs 174 adjacent the bottom which fit inside of the frame 114 for lateral stability.

Door 126 is arranged to be held in an open position by a panel 176, FIG. 2, slidable vertically on a rail or guide standard 178 secured to the base member 82 and having releasable latching support by a conventional latching mechanism 180 secured to the bar 178. Panel 176 has a finger loop 182 thereon for manual engagement and also has a top projection 184 which engages the door in the lifting and lowering movements. Door 126 has lock means 188 similar to the lock means on the door 124. In the raised position of door 126, FIG. 2, panel 176 provides end protection for the carrier portion against rain or other weather elements.

Base member part 82a is provided with an air conditioning, temperature, and humidity control unit 194 of conventional construction, FIGS. 2 and 9, for maintaining ideal conditions in the interior of the base member for circulating through the electronic switching mechanism of the carrier portion. The unit 194 has a filtered inlet 196 which excludes dust and moisture. The outlet 198, FIGS. 3, and 9, for this unit is on the opposite side of the base member. Circulation of the air as cooled, heated, and/or humidified is accomplished by a fan 199 in the housing. Circulation is through oppositely located apertures 200 in the top wall of base member part 82a and suitable filter means 202. Such circulation is primarily within the carrier portion for maintaining the electronic carrier equipment in its most efficient operating condition, although circulation will of course occur also into and out of the cross connect through wire access holes to maintain it at an operating temperature and dust and moisture free.

The structure thus far described includes a housing arranged to receive a combination of cross connect equipment and carrier equipment. It can however have structure to enclose cross connect equipment alone, such as the embodiment shown in FIG. 4. The base member of FIG. 4, designated by the reference numeral 82' is similarly formed of two parts 82a' and 82b', these two parts being similarly attachable with each other as shown in FIG. 8 but the part 82a' being shorter in length than in the first embodiment. Instead of an intermediate frame 114 as in the first embodiment, the embodiment of FIG. 4 utilizes an end closure 204 secured to the base part 82a' similar to the bolted connection 116, 118 shown in FIG. 7. It has an end wall 206, side walls 208, and a top wall 210, the rear and bottom being open. The door 124 and its hardware, seals, lock, etc. are the same as shown in connection with the first embodiment.

Although the present enclosure, including the parts 82, 114, 124 and 126 can be constructed of metal, they preferably are constructed of a plastic, such as fiber-reinforced polyester which is rust and corrosion proof, resistant to impact damage, and virtually maintenance free.

In the use of the present invention, the manufacturer can furnish the pad 44, or if desired, the consumer may provide its own pad. Where the consumer furnishes its own pad, studs must be installed according to proper specifications for attachment thereto of the upstanding support brackets 72 which support the communication equipment on the pad. A threaded engagement for bolt 113 must also be incorporated in the pad.

The present invention has the desirable feature of allowing one enclosure to be substituted for another in the event it is desired to increase the capacity of the equipment. That is, the cross connect-carrier assembly has integral and independent securement and support on the pad by brackets 72, and the enclosure can be readily removed therefrom, leaving the cross connect-carrier assembly standing freely on the pad. This removal is accomplished by opening the doors 124 and 126, removing bolts 108 between the base member parts 82a and 82b, and taking off base member part 82b, removing bolt 113 and screws 36, loosening bolts 76, and then sliding the entire base member part 82a and the connected doors off the pad. The capacity of the cross connect-carrier equipment can be enlarged and a larger enclosure installed in the reverse order of removal. The removed enclosure can be reused on another job. This change can be made without an interruption of telephone service.

As an illustration of the versatility of the present invention, initial installations may comprise simply a cross connect and the single door enclosure shown in FIG. 4. As the service to customers expands, it may be necessary to add the carrier equipment shown in FIG. 2. It is merely necessary in such a case to remove the single door enclosure and replace it with a double door enclosure. Or, if additional carrier or cross connect equipment is necessary, it is merely necessary to substitute larger enclosures and larger pad portions 52 if necessary.

Another important feature of the present invention is that by the use of selected lock mechanism on the two doors, access can be provided at each end for different authorized personnel. Also, the doors when open in their upright, horizontal position provide shelter from rain or the like. The panel 176 provides protection of the delicate carrier portion from the large open bottom end of the door 126 when raised. The housing is designed to be attractive in appearance. The seals around the doors and the floor plate exclude dust and moisture.

It is to be understood that the form of our invention herein shown and described is to be taken as a preferred example of the same and that various changes in the shape, size and arrangement of parts may be resorted to without departing from the spirit of our invention or the scope of the subjoined claims.

Having thus described our invention, we claim:

1. An enclosure for outdoor, ground level mounted communication equipment comprising
 a ground mounted pad with an opening therein for receiving underground wire therethrough,
 securing and support means on said pad arranged to secure and support upstanding communication equipment thereon,
 a base member supported on said paid having front, rear, top and side portions, and
 a housing integral with said base member enclosing communication equipment on said pad,
 said housing including door means providing access to the communication equipment in said housing,
 and releasable securing means on said pad overlying a portion of said base member and clamping said base member detachably onto said pad.

2. The enclosure of claim 1 wherein said securing and support means on said pad comprise upstanding brackets integral with said pad and a floor plate supported on said brackets including a portion of said releasable securing means which secure said base member detachably to said pad.

3. The enclosure of claim 2 wherein said floor plate includes openings for receiving communication cables extending from underground to communication equipment on said pad.

4. The enclosure of claim 1 wherein said base member is open at the bottom and includes bottom edges which seat on said pad, an opening in the top of said base member, said securing and support means on said pad comprising upstanding brackets integral with said pad and a floor plate supported on said brackets for closing the opening in the top of said base member, said floor plate including a portion of said releasable securing means which secure said base member detachably to said pad.

5. The enclosure of claim 4 wherein said floor plate overlaps the top of said base member at said opening, said upstanding brackets being of less height than the sides of said base member whereby upon securing said releasable securing means, said floor plate bears down on said base member to hold it in place and when said releasable securing means is released, said base member can be removed from said pad.

6. The enclosure of claim 4 wherein said floor plate overlaps the top of said base member at said opening, said upstanding brackets being of less height than the sides of said base member whereby upon securing said releasable securing means, said floor plate bears down on said base member to hold it in place and when said releasable securing means is released, said base member can be removed from said pad, and seal means between said floor plate and said base member in their overlapping portion.

7. The enclosure of claim 1 wherein said pad includes an outer auxiliary removable portion whereby the overall size of said pad can be varied by substituting one removable outer auxiliary portion for another.

8. The enclosure of claim 1 including a pair of said door means on opposite portions of said housing providing double access to said housing.

9. The enclosure of claim 1 including a pair of said door means on opposite portions of said housing providing double access to said housing, and lock means for each of said door means, said lock means requiring separate keys whereby to provide access to opposite ones of said door means by different authorized personnel.

10. An enclosure for outdoor, ground level mounted communication equipment comprising
a ground mounted pad with an opening therein for receiving underground wire therethrough,
securing and support means on said pad arranged to secure and support upstanding communication equipment thereon,
a housing removably mounted on said pad enclosing communication equipment on said pad,
door means on said housing providing access to the equipment in said housing, and
an outer auxiliary removable portion forming a part of said pad whereby the over-all size of said pad can be varied by substituting one removable outer auxiliary portion for another.

11. An enclosure for outdoor, ground level mounted communication equipment comprising
a base member having front, rear, top and side portions,
an upright frame on said base member, and
a door supported on said frame having a front wall, side walls, and a top wall, the bottom and rear of said door being open and combining with portions of said base member for enclosing equipment in the closed position of said door, and
panel means on a forward portion of said base member movable vertically from a lower rest position to an upper raised position,
said panel means in its raised position being disposed against the front of said door in the raised position of the latter to hold the door raised and being disposed between said side walls to prevent inlet of water elements.

12. An enclosure for outdoor, ground level mounted communication equipment comprising
a ground mounted pad with an opening therein for receiving underground wire therethrough,
securing and support means on said pad arranged to secure and support upstanding communication equipment thereon,
a base member supported on said pad having front, rear, top and side portions and having first and second parts,
the first part of said base member being associated with said securing and support means for releasable engagement with communication equipment and the second part of said base member comprising an end cap which when removed allows releasable engagement of the two parts from communication equipment.

13. An enclosure for outdoor, ground level mounted communication equipment comprising
a hollow base member having front, rear, top and side portions,
an upright frame on said base menber,
a door supported on said frame, said door being hinged whereby when swung outwardly to an open position it provides access to the interior of the enclosure,
an air conditioning means in said hollow base member.

14. The enclosure of claim: 13 including temperature control and humidifying means in said housing.

* * * * *